(12) United States Patent
Sugimoto et al.

(10) Patent No.: US 8,188,514 B2
(45) Date of Patent: May 29, 2012

(54) TRANSISTOR

(75) Inventors: Masahiro Sugimoto, Toyota (JP); Tat-Sing Paul Chow, Niskayuna, NY (US); Zhongda Li, Troy, NY (US); Tetsu Kachi, Aichi-ken (JP); Tsutomu Uesugi, Aichi-ken (JP)

(73) Assignees: Rensselaer Polytechnic Institute, Troy, NY (US); Toyota Jidosha Kabushiki Kaisha, Toyota-shi (JP)

( * ) Notice: Subject to any disclaimer, the term of this patent is extended or adjusted under 35 U.S.C. 154(b) by 181 days.

(21) Appl. No.: 12/540,230

(22) Filed: Aug. 12, 2009

(65) Prior Publication Data

US 2010/0038681 A1 Feb. 18, 2010

Related U.S. Application Data

(60) Provisional application No. 61/089,065, filed on Aug. 15, 2008.

(51) Int. Cl.
*H01L 29/66* (2006.01)

(52) U.S. Cl. ............ 257/194; 257/12; 257/15; 257/183; 257/200

(58) Field of Classification Search .................... 257/12, 257/51, 183, 200, 194
See application file for complete search history.

(56) References Cited

U.S. PATENT DOCUMENTS

| 2007/0170436 A1* | 7/2007 | Sugawara ....................... 257/77 |
| 2008/0099767 A1 | 5/2008 | Shakuda |
| 2008/0135880 A1 | 6/2008 | Yoshida et al. |
| 2009/0134456 A1 | 5/2009 | Sugimoto et al. |

FOREIGN PATENT DOCUMENTS

| JP | 2001-177094 A | 6/2001 |
| JP | 2007-005764 A | 1/2007 |
| JP | 2007-273856 A | 10/2007 |
| JP | 2008-071877 A | 3/2008 |
| JP | 2008-130672 A | 6/2008 |

OTHER PUBLICATIONS

Kanechika, M. et al.: A Vertical Insulated Gate AlGan/GaN Heterojunction Field-Effect Transistor, The Japan Society of Applied Physics, Japanese Journal of Applied Physics, vol. 46, No. 21, 2007, pp. L503-L505.

* cited by examiner

*Primary Examiner* — Tan N Tran
(74) *Attorney, Agent, or Firm* — Kenyon & Kenyon LLP

(57) ABSTRACT

An HEMT type transistor is disclosed that is a normally off type, and in which variations in the gate threshold voltage are small. A transistor is provided with a p-type region, a barrier region, an insulation film, a gate electrode. The channel region is connected to an upper surface of the p-type region. The channel region is n-type or i-type and provided with a first channel region and a second channel region. The barrier region is forming a hetero-junction with an upper surface of the first channel region. The insulation film is connected to an upper surface of the second channel region and an upper surface of the barrier region. The gate electrode faces the second channel region and the barrier region via the insulation film. The first channel region and the second channel region are arranged in series in a current pathway.

4 Claims, 9 Drawing Sheets

TRANSISTOR

CROSS-REFERENCE TO RELATED APPLICATION

This application claims priority to U.S. provisional Patent Application No. 61/089065 filed on Aug. 15, 2008, the contents of which are hereby incorporated by reference into the present application.

BACKGROUND OF THE INVENTION

1. Field of the Invention

The technique disclosed in the present specification relates to a transistor. In particular, the technique relates to a transistor that uses a 2DEG formed by a hetero-junction as a channel.

2. Description of the Related Art

FIG. 3 of Japanese Patent Laid-Open Application Publication No. 2007-273856 discloses a High Electron Mobility Transistor (hereinafter "HEMT"). The HEMT utilizes a two dimensional electron gas (hereinafter "2DEG") as a channel. The 2DEG is generated by a hetero-junction of a GaN layer and an AlGaN layer. With this HEMT, a p-type GaN layer is formed in a position adjacent to the GaN layer that functions as the channel (as such, hereinafter referred to as "channel GaN layer"). When the gate voltage is turned off, the depletion layer expands from the p-type GaN layer to the channel GaN layer, and the 2DEG dissipates. Thus, when the gate voltage is in the off state, the HEMT is off. When the gate voltage is turned on, electrons are attracted to the hetero-junction, and 2DEG is formed. In this way, the HEMT is turned on. In this manner, this technology achieves a normally off type HEMT by forming a p-type GaN layer in a position adjacent to the channel GaN layer.

BRIEF SUMMARY OF THE INVENTION

The HEMT noted above causes the 2DEG to dissipate during the gate voltage is not applied. This is caused by the depletion layer being extended from the p-type GaN layer to the channel GaN layer during such moments. The gate threshold voltage of the HEMT depends upon the carrier density of the channel GaN layer, the thickness of the channel GaN layer, the density of the 2DEG generated at the junction between the AlGaN layer and the channel GaN layer, and the thickness of the gate insulation film. Amongst these primary factors, there is a large amount of variation in the density of the 2DEG, and thus control of the gate threshold voltage is quite difficult. Thus, a conventional normally off type of HEMT has a problem, in that there is a large amount of variation in the gate threshold voltage.

A transistor disclosed in the present specification comprises a p-type region, a channel region, a barrier region, an insulation film, and a gate electrode. The channel region is connected to an upper surface of the p-type region, and is n-type or i-type. The channel region comprises a first channel region and a second channel region. The barrier region is forming a hetero-junction with an upper surface of the first channel region. The insulation film is connected to an upper surface of the second channel region and an upper surface of the barrier region. The gate electrode faces the second channel region and the barrier region via the insulation film. The first channel region and the second channel region are arranged in series in a current pathway.

With this transistor, the first channel region and the second channel region are formed in the channel region. A structure in which the barrier region, the insulation film and the gate electrode are stacked is formed on the upper surface of the first channel region. A structure in which the insulation film and the gate electrode are stacked is formed on the upper surface of the second channel region. When the gate voltage is turned off, the depletion layer expands from the p-type region to the channel region, and the transistor is thereby turned off. At this point, the second channel region is completely depleted because the barrier region is not formed on the upper surface of the second channel region. Because the transistor is turned off by completely depleting the second channel region, the gate threshold voltage is determined by primary factors other than the density of the 2DEG of the first channel. Because the density of a 2DEG having a large amount of variation does not affect the gate threshold voltage, the amount of variation in the gate threshold voltage of this transistor is small.

In addition, when the gate voltage is turned on, the 2DEG is formed in the vicinity of the hetero-junction between the barrier region and the first channel region, and an electron accumulation layer is formed in the second channel region in the vicinity of the portion in contact with the insulation film. Because a channel is formed by the 2DEG and the accumulation layer, the transistor is thereby turned on. As noted above, the channel region is depleted by the adjacent p-type region when turned off, and the channel is formed in the channel region by the electric field of the gate electrode when turned on. Because of this, a high carrier density is not needed in the channel region, and the density of impurities contained in the channel region can be low. Because of this, mobility of the electrons that flow through a channel when the transistor is turned on is of a high degree. Moreover, a highly dense 2DEG is formed in the first channel region. Thus, this transistor can operate at high speeds at small losses.

DETAILED DESCRIPTION OF THE INVENTION

Figure 1:
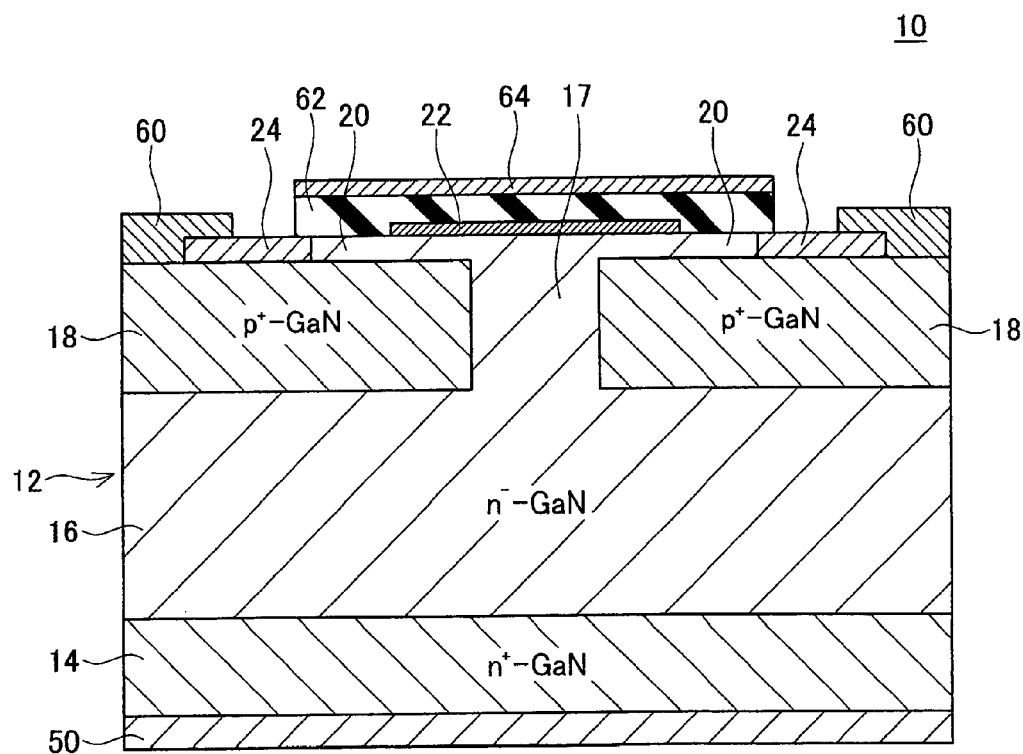
FIG. 1 is a cross-sectional view of a transistor 10 of a first embodiment.

In below, some of the features that the transistor disclosed herein may comprise will be described.

Preferably, the aforementioned transistor further includes a drift region, a source region and a drain region. The drift region may comprise a lower drift region formed on a lower side of the p-type region and an aperture drift region extending from the lower side of the p-type region to an upper side of the p-type region through an aperture portion of the p-type region. The drift region may be n-type. The drift region may be connected to one end of the channel region. The source region may be connected to the other end of the channel region. The drain region may be formed on a lower side of the drift region.

Preferably, the aforementioned transistor comprises the characteristics below. The drift region may be connected to the first channel region. The source region may be connected to the second channel region. A layered structure of the barrier region, the insulation film and the gate electrode may be formed on the aperture drift region. The insulation film above the aperture drift region may have a first thickness. The insulation film above the first channel region may have a first thickness on the aperture drift region side, and has a second thickness that is thinner than the first thickness on the second channel region side.

With this transistor, the layered structure comprising the barrier region, the insulation film and the gate electrode extends from above the upper portion of the first channel region to above the upper portion of the aperture drift region. It is difficult to expand the depletion layer in the aperture drift region because there is no p-type region in the aperture portion. Thus, when the gate voltage is turned off, the depletion layer in the aperture drift region becomes thin. However, with this transistor, the insulation film above the aperture drift region is thick, and thus an electric field in the aperture drift region is reduced (i.e. the strength enduring high voltage between the gate electrode and the lower drift region on the lower side of the aperture drift region is ensured). In addition, the thickness of the insulation film above the first channel region is a first thickness on the aperture drift region side, and is a second thickness that is thinner than the first thickness on the second channel region side. Thus, the insulation film on the second channel region can be formed thinly as with the second thickness. In a case where the insulation film on the second channel region is formed thinly, an accumulation layer having a sufficient density of electrons can be formed in the second channel region, even with a low gate voltage. In addition, although the thickness of the insulation film above the first channel region varies depending on its locations, because the hetero-junction is formed at the first channel region, a sufficient density of 2DEG can be achieved in the first channel region regardless of the thickness of the insulation film. On the other hand, an electric field easily concentrates at the portion in which the thickness of the insulation film varies. However, in a case where the thickness of the insulation film varies above the first channel region, density of the electric field can be suppressed because the electric field can be dispersed above the first channel region.

Figure 15:
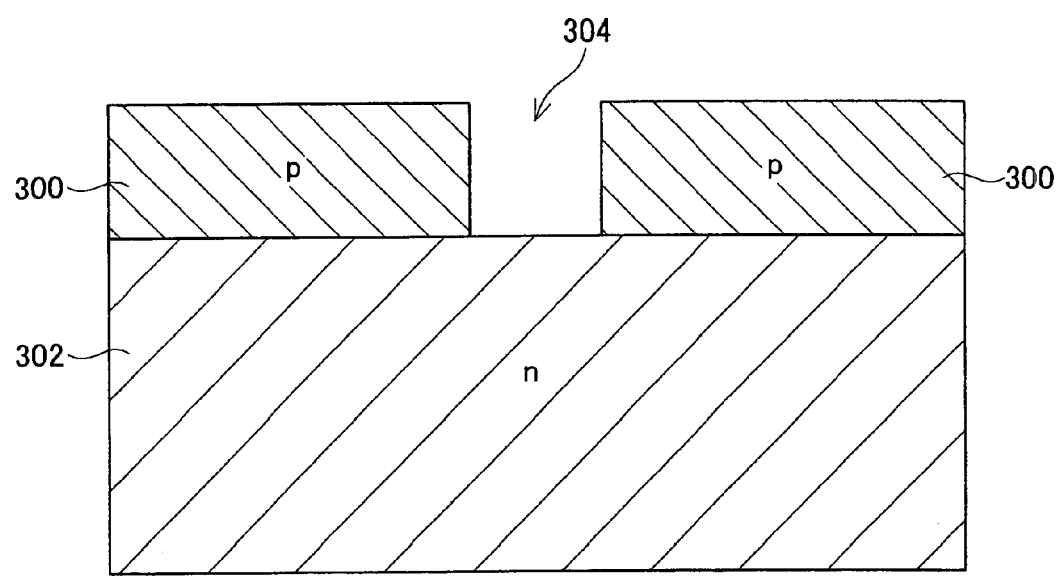
FIGS. 15-17 are cross-sectional views showing the manufacturing steps of a transistor in which the p-type region is thick.
Figure 16:
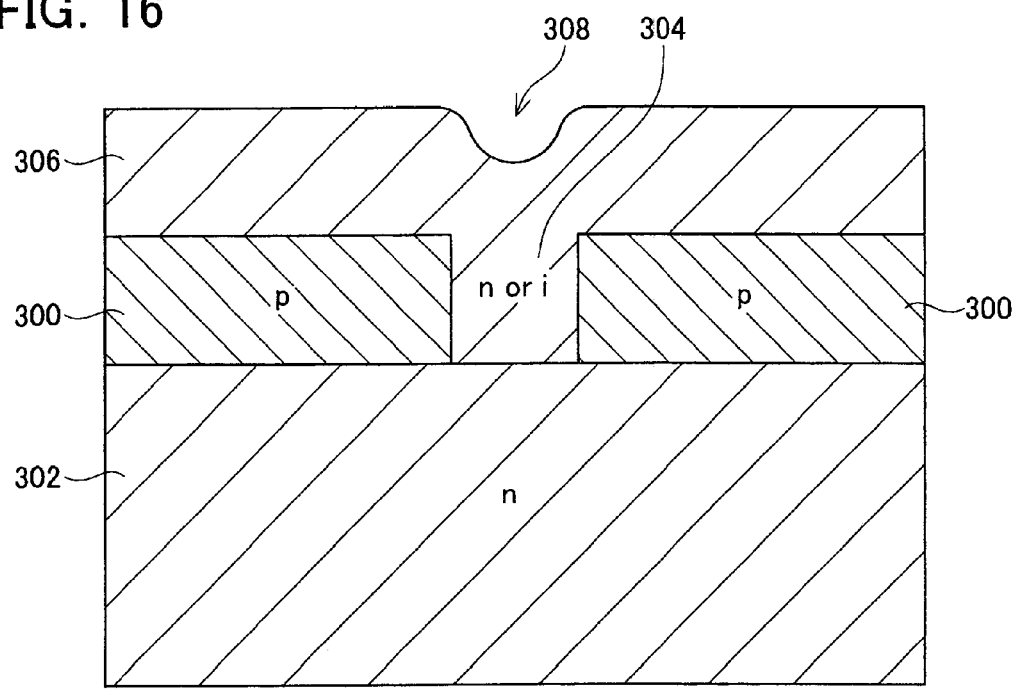
Figure 17:
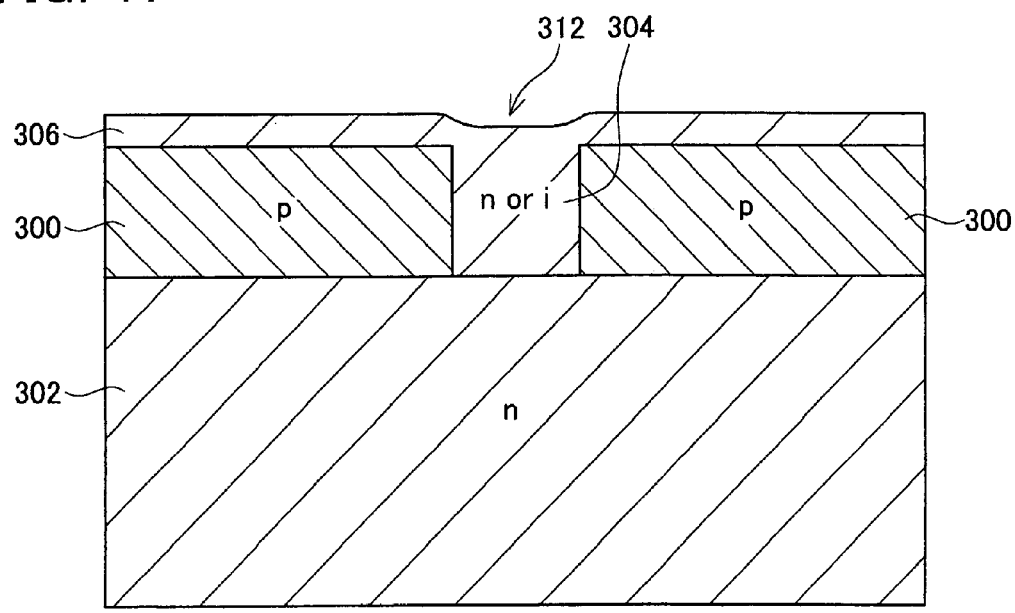

In the aforementioned transistor, the p-type region insulate between the drift region below the p-type region and the channel region on the p-type region. Thus, when the drift region and the channel region are insulated only at the p-type region, the p-type region must be thick in order to ensure high breakdown voltage. When the p-type region is thick, a problem occurs in which a concave portion is formed on the surface of the aperture drift region. As exemplified in FIG. 15, a p-type region 300 is formed by means of epitaxial growth on a drift region 302. An aperture portion 304 is formed by means of etching in the p-type region 300. As shown in FIG. 16, after the aperture portion 304 is formed, an n-type or i-type semiconductor layer 306 is formed by epitaxial growth. Because the aperture portion 304 is concave, a concave portion 308 is also formed on the surface of the semiconductor layer 306. Next, the semiconductor layer 306 is etched back. At this point, as shown in FIG. 17, the semiconductor layer 306 is left on the p-type region 300 and inside the aperture portion 304. The semiconductor layer 306 remaining on the p-type region 300 is a channel region, and the semiconductor layer 306 remaining inside the aperture portion 304 is the aperture drift region of the drift region 302. At this point, as shown in FIG. 17, a concave portion 312 is formed on the surface of the semiconductor layer 306. In a case where the insulation film, the gate electrode, etc. are formed on the semiconductor layer 306 having concave portion 312, the breakdown voltage of the fabricated transistor decreases because an electric field concentrates and the depletion layer becomes thin in the vicinity of the aperture drift region when transistor is off.

Thus, it is preferable that in the aforementioned transistor, a high resistance region having an electrical resistance (i.e. a breakdown voltage) higher than the drift region is formed between the p-type region and the lower drift region.

With this transistor, the channel region is insulated from the lower drift region by both the p-type region and the high resistance region. Because the electrical resistance (i.e. the breakdown voltage) of the high resistance region is high, the p-type region can be thin. Thus, the formation of a concave portion on the surface of the aperture drift region is inhibited when fabricating the transistor.

Some of the characteristics of the transistor explained below will be enumerated.

(Characteristic 1) The drain region, the source region, and the drift region may be formed of n-type GaN. The density of the n-type impurities in the drift region may be lower than in the drain region and in the source region.

(Characteristic 2) The channel region may be formed of n$^-$-type or i-type GaN. In a case where the channel region is n$^-$-type, the density of the n-type impurities in the channel region may be lower than in the source region.

(Characteristic 3) The p-type region may be formed of GaN.

(Characteristic 4) The barrier region may be formed of a material in which the energy band gap is wider than in the channel region. More specifically, the barrier region may be formed of $In_xAl_yGa_{1-x-y}N$ ($0 \leq x \leq 1$, $0 \leq y \leq 1$, $0 \leq 1-x-y \leq 1$).

(Characteristic 5) A current pathway between the source electrode and the drain electrode may be constructed of the source region, the channel region, the drift region, and the drain region.

(First Embodiment)

FIG. 1 shows a cross-sectional view of a transistor 10 of the first embodiment. The transistor 10 comprises a semiconductor substrate 12, a drain electrode 50 formed on the lower surface of the semiconductor substrate 12, a source electrode 60 formed on the upper surface of the semiconductor substrate 12, a gate insulation film 62, and a gate electrode 64.

A drain region 14, a drift region 16, a p-type region 18, a channel region 20, a barrier region 22, and a source region 24 are formed in the semiconductor substrate 12.

The drain region 14 is formed in an area that includes the lower surface of the semiconductor substrate 12. The drain region 14 is formed of GaN that contains n-type impurities at a high density, and is in ohmic contact with the drain electrode 50.

The drift region 16 is formed on the upper side of the drain region 14. The drift region 16 is formed of GaN that contains n-type impurities at a low density. The p-type region 18 is formed on the upper side of the drift region 16. The p-type region 18 is formed in an area that excludes the aperture portion 17. The p-type region 18 is formed by GaN that contains p-type impurities at a high density. The drift region 16 extends into the aperture portion 17 (i.e. the drift region 16 extending through the aperture portion 17 is the aperture drift region).

Figure 2:
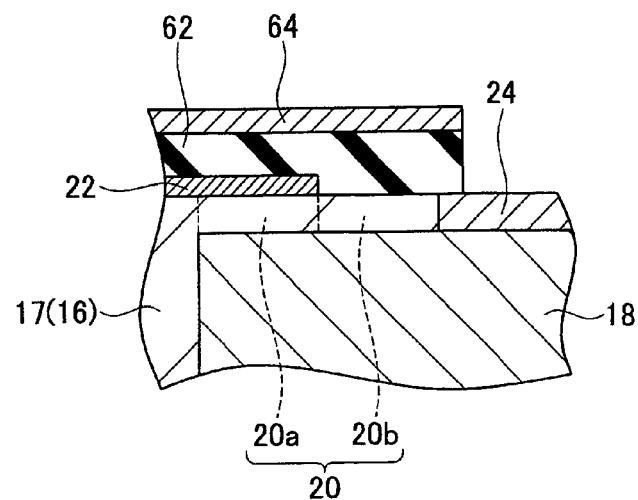
FIG. 2 is an enlarged cross-sectional view in the vicinity of a channel region 20 of the transistor 10 of a first embodiment.

The channel region 20 is formed on the upper side of the p-type region 18. The channel region 20 is formed by GaN that contains n-type impurities at a low density. In addition, the barrier region 22 is formed on the upper side of the channel region 20 and the aperture drift region 17. The barrier region 22 is formed of $In_xAl_yGa_{1-x-y}N$. The aforementioned variables x and y satisfy the relationships: $0 \leq x \leq 1$, $0 \leq y \leq 1$, and $0 \leq 1-x-y \leq 1$. FIG. 2 shows an enlarged view in the vicinity of the channel region 20. As shown in FIG. 1 and FIG. 2, the barrier region 22 covers a region 20a in the channel region 20 and the entire surface of the aperture drift region 17. In a region 20b that is not covered by the barrier region 22, the channel region 20 is covered with the gate insulation film 62. Below the region 20a of the channel region 20 that is covered with the barrier region 22 will be referred to as the first channel region 20a, and the region 20b of the channel region 20 that is covered with the gate insulation film 62 will be referred to as the second channel region 20b. $In_xAl_yGa_{1-x-y}N$ has an energy band gap that is wider than GaN. Thus, the barrier region 22 (the $In_xAl_yGa_{1-x-y}N$ layer) is forming a hetero-junction with a GaN layer (i.e. the first channel region 20a and the aperture drift region 17). As shown in FIG. 2, the first channel region 20a is formed between the aperture drift region 17 and the second channel region 20b. In addition, the second channel region 20b is formed between the first channel region 20a and the source region 24.

As shown in FIG. 1, the source region 24 is formed on the upper side of the p-type region 18, and between the source electrode 60 and the channel region 20. The source region 24 is formed of GaN that contains n-type impurities at a high density. The source region 24 is in ohmic contact with the source electrode 60.

The gate insulation film 62 covers the channel region 20 and the barrier region 22. The gate electrode 64 is formed on the gate insulation film 62. The gate electrode 64 faces the channel region 20 and the barrier region 22 via the gate insulation film 62. In other words, a layered structure comprising the barrier region 22, the gate insulation film 62 and the gate electrode 64 is formed on the first channel region 20a and the aperture drift region 17. A layered structure comprising the gate insulation film 62 and the gate electrode 64 is formed on the second channel region 20b.

Next, the operation of the transistor 10 will be explained. When the transistor 10 is to be used, a voltage is applied between the drain electrode 50 and the source electrode 60. The voltage is positive on the drain electrode 50 side. With the gate voltage in the off state, the depletion layer expands from the p-type region 18 to the channel region 20. At this point, it is thought that the electrons exist in the vicinity of the hetero-junction between the first channel region 20a and the barrier region 22 at a low density In other words, it is assumed that the first channel region 20a is not completely depleted. In contrast, the second channel region 20b is completely depleted. Thus, the transistor 10 is off.

When the gate voltage is turned on, electrons are drawn into the upper portion of the channel region 20. In the first channel region 20a, electrons concentrate at a high density in the surface layer (the vicinity of the hetero-junction), and a two dimensional electron gas (2DEG) is formed. In the second channel region 20b, electrons concentrate in the surface layer (the vicinity of the interface between the second channel region 20b and the gate insulation film 62), and an electron accumulation layer is formed therein. A channel is formed by the 2DEG in the first channel region 20a and the accumulation layer in the second channel region 20b. Thus, electrons can flow from the source electrode 60 to the drain electrode 50 via the source region 24, the second channel region 20b, the first channel region 20a, the drift region 16, and the drain region 14. In other words, the transistor 10 turns on.

As explained above, with the transistor 10 of the first embodiment, the channel region 20 is formed by the first channel region 20a and the second channel region 20b that are arranged in series. Because the threshold voltage of the second channel region 20b does not depend on the density of the 2DEG, variation in the threshold voltage of the transistor 10 is small. In addition, because the entire channel region 20 is formed of $n^-$-type layer, the density of impurities in the channel region 20 is extremely low. Thus, the electrons are not inhibited so much to move in the channel by the impurities, and thus the electron mobility is quite high. In particular, with the first channel region 20a, because a channel is formed by a highly dense 2DEG, the mobility of the electrons is extremely high. In this way, the transistor 10 has a lower on-resistance and cam operate at high speed.

Figure 3:
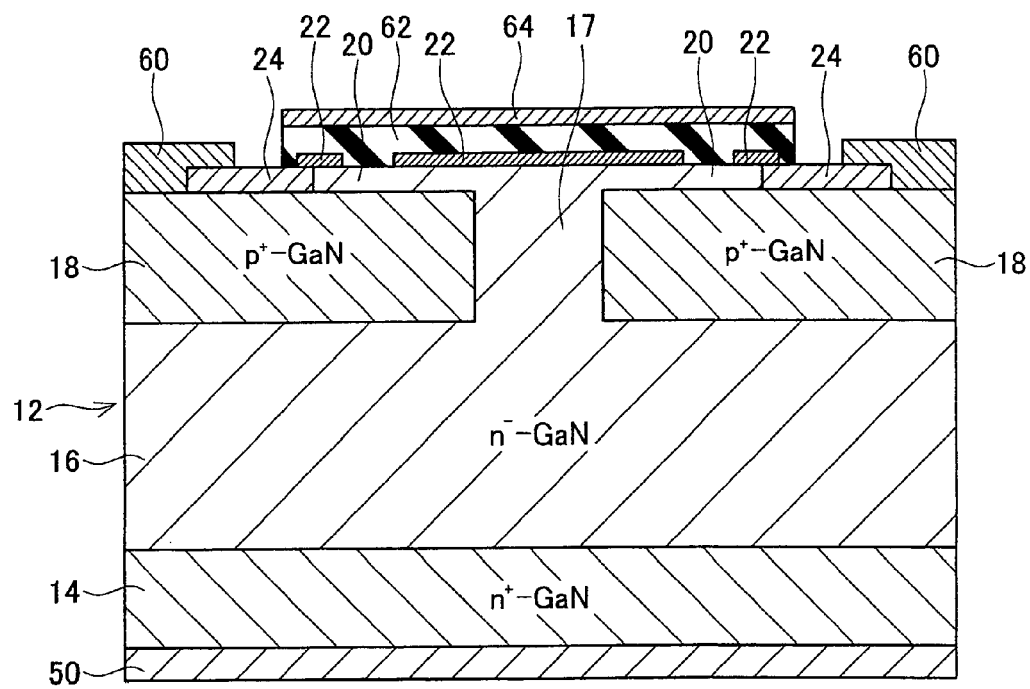
FIG. 3 is a cross-sectional view of a transistor in which the first embodiment is modified.
Figure 4:
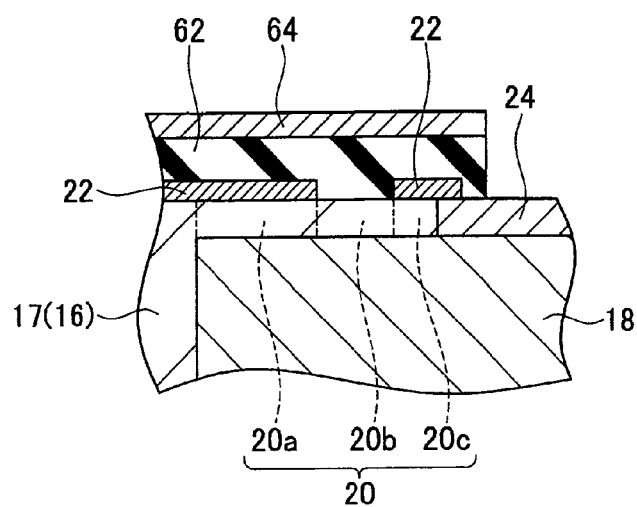
FIG. 4 is an enlarged cross-sectional view in the vicinity of a channel region 20 of the transistor of FIG. 3.

Note that with the transistor 10 of the first embodiment, the second channel region 20b is connected to the source region 24. However, as shown in FIG. 3 and FIG. 4, the barrier region 22 may also be formed on the region of the channel region 20 that is connected to the source region 24. In other words, with the transistor of FIG. 3 and FIG. 4, a third channel region 20c that is forming the hetero-junction with the barrier region 22 is formed between the second channel region 20b and the source region 24. Thus, by connecting the third channel region having the hetero-junction to the source region 24, the contact resistance between the source region 24 and the channel region 20 can be reduced.

(Second Embodiment)

Figure 5:
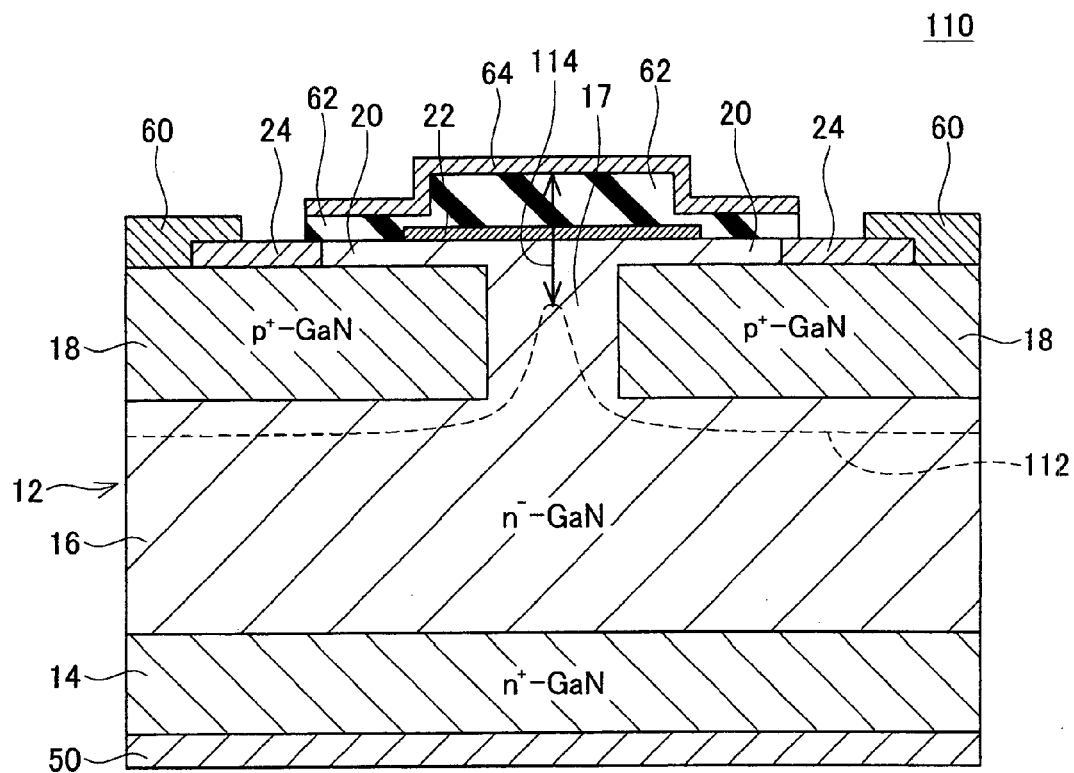
FIG. 5 is a cross-sectional view of a transistor 110 of a second embodiment.

Next, a transistor 110 of a second embodiment will be explained. FIG. 5 shows a cross-sectional view of the transistor 110 of the second embodiment. As shown in FIG. 5, with the transistor 110 of the second embodiment, the thickness of the gate insulation film 62 differs depending upon location. The configuration of the other portions thereof is the same as the transistor 10 of the first embodiment.

Figure 6:
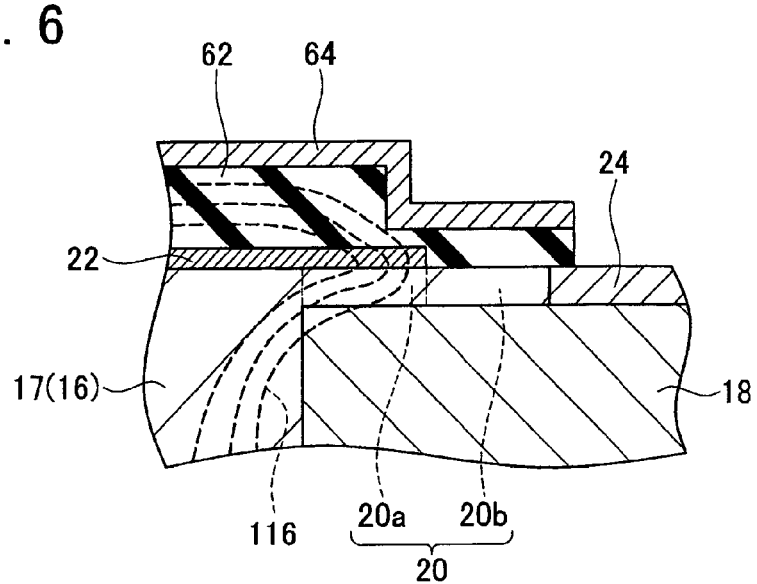
FIG. 6 is an enlarged cross-sectional view in the vicinity of a channel region 20 of the transistor 110 of the second embodiment.

FIG. 6 shows an enlarged view in the vicinity of the channel region 20 of the transistor 110. As shown in FIG. 6, the gate insulation film 62 above the aperture drift region 17 is thick. The thickness of the gate insulation film 62 above the aperture drift region 17 is approximately uniform. The thickness of the gate insulation film 62 varies above the first channel region 20a. In a position near the aperture drift region 17, the thickness of the gate insulation film 62 is the same as that of the gate insulation film 62 above the aperture drift region 17. On the other hand, in a position near the second channel region 20b, the thickness of the gate insulation film 62 is thinner than the gate insulation film 62 above the aperture drift region 17.

Between the first channel region 20a and the second channel region 20b, the surface of the gate insulation film 62 extends approximately horizontally from above the first channel region 20a toward above the second channel region 20b. Thus, the thickness of the gate insulation film 62 on the second channel region 20b is approximately the same as the thickness of the combination of the insulation film 62 and the barrier region 22 above the first channel region 20a. The gate insulation film 62 on the second channel region 20b is thinner than the gate insulation film 62 above the aperture drift region 17, and the thickness of the gate insulation film 62 on the second channel region 20b is approximately uniform.

The broken line 112 of FIG. 5 schematically shows the distribution of the depletion layer when the gate voltage is off. The central portion of the aperture drift region 17 is at a distance from the p-type region 18, and thus it is difficult for the depletion layer to expand in the central portion sufficiently. Because of this, the thickness of the depletion layer becomes thinner in the central portion of the aperture drift region 17. However, with the transistor 110, because the gate insulation film 62 above the aperture drift region 17 is thick, an electric field between the gate electrode 64 and the drift region 16 is reduced (i.e. the thickness of the gate insulation film 62 and the depletion layer (distance 114 of FIG. 5) is ensured). In this way, a breakdown voltage in the aperture drift region 17 is improved. In addition, the gate insulation film 62 is thinly distributed at a uniform thickness on the second channel region 20b. Thus, when the gate voltage is applied, an electron accumulation layer (channel) having a sufficient density is formed in the second channel region 20b. In addition, the thickness of the gate insulation film 62 above the first channel region 20a varies depending upon location thereamong. In other words, the gate insulation film 62 is thick on the aperture drift region 17 side and thin on the second channel region 20b side. The electric field generated when the gate voltage is applied becomes low in the first channel region 20a below the thick gate insulation film 62. However, the first channel region 20a has the hetero-junction with the barrier region 22, and thus a 2DEG having sufficient density is generated even in a low electric field. Thus, when the gate voltage is applied, a 2DEG (channel) having a sufficient density is formed in the first channel region 20a.

Figure 7:
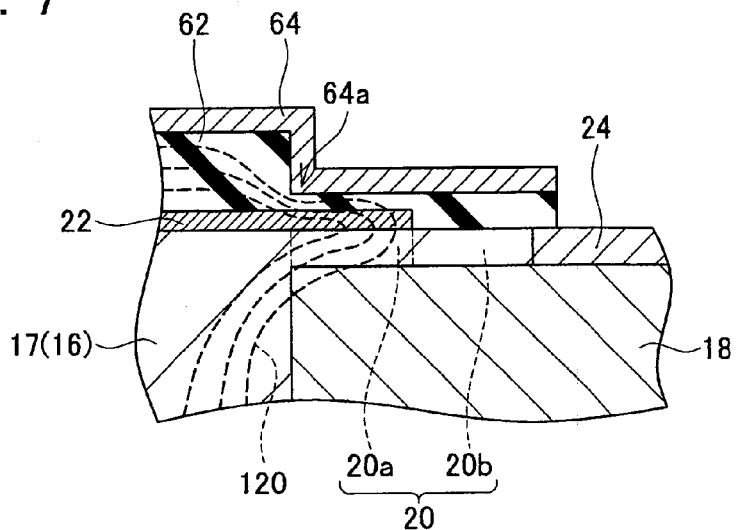
FIG. 7 is an enlarged cross-sectional view in the vicinity of a channel region 20 of a transistor of a comparative example.

In addition, in a case where the thickness of the gate insulation film 62 is varied, the electric field may become higher in the vicinity of the portion in which the thickness changes. For example, as shown in FIG. 7, a case is considered in which only the gate insulation film 652 above the aperture drift region 17 is formed to be thick, and the entire gate insulation film 652 above the first channel region 20a is formed to be thin. The broken lines 120 of FIG. 7 show the electric field (isoelectric lines) generated in a transistor when the gate voltage is not applied. In this case, the electric field become higher in the corner portion 64a of the gate electrode 64, and thus insulation breakdown can easily occur at the corner portion 64a. The broken lines 116 of FIG. 6 show the electric field (isoelectric lines) generated in the transistor 110 of the second embodiment when the gate voltage is not applied. As shown in FIG. 6, with the transistor 110, because the thickness of the gate insulation film 62 varies above the first channel region 20a, a region in which isoelectric lines can disperse is formed. Thus the electric field in the corner portion of the gate electrode 64 is weakened.

As explained above, with the transistor 110 of the second embodiment, the gate insulation film 62 above the aperture drift region 17 is thick, the thickness of the gate insulation film 62 varies above the first channel region 20a, and the gate insulation film 62 on the second channel region 20b is thin. Thus, the breakdown voltage of the aperture drift region 17 is ensured to be high, and the electric field in the corner portion of the gate electrode 64 is suppressed. In addition, even if the gate insulation film 62 is formed in this way, a channel having a sufficient electron density is formed in both the first channel region 20a and the second channel region 20b. In addition, because the gate insulation film 62 above the aperture drift region 17 is thick, the electrostatic capacitance between the gate electrode 64 and the drain electrode 50 becomes small. Thus, the switching speed of the transistor 110 is increased.

Note that in the transistor 110 of the second embodiment, the thickness of the gate insulation film 62 on the first channel region 20a was shifted between two levels; however, the thickness of the gate insulation film 62 may be shifting in three or more levels, or may gradually be made thinner from the aperture drift region 17 side toward the second channel region 20b side.

(Third Embodiment)

Figure 8:
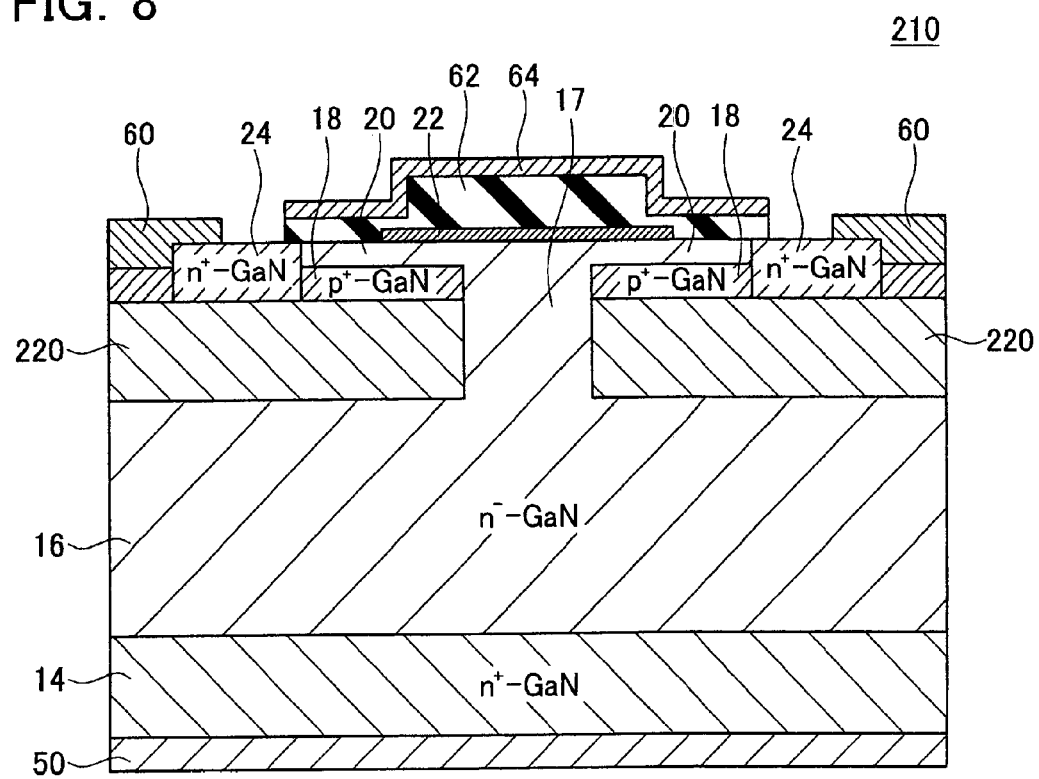
FIG. 8 is a cross-sectional view of a transistor 210 of a third embodiment.

Next, a transistor 210 of a third embodiment will be explained. FIG. 8 shows a cross-sectional view of the transistor 210 of the third embodiment. As shown in FIG. 8, a high resistance region 220 is formed on the lower side of the p-type region 18 (between the p-type region 18 and the drift region 16). The high resistance region 220 is formed by GaN in which Al is implanted at a high density, and the electrical resistance thereof is quite high. In addition, the thickness of the p-type region 18 is extremely thin. The configuration of the other portions thereof is the same as the transistor 110 of the second embodiment.

With the transistor 210, the upper structure (the source electrode 60, the source region 24, and the channel region 20) is insulated from the drift region 16 below the high resistance region 220 by the p-type region 18 and the high resistance region 220. Because the insulating capability of the high resistance region 220 is high, a voltage resistance can be ensured between the upper structure and the drift region 16, even if the p-type region 18 is thin.

Figure 9:
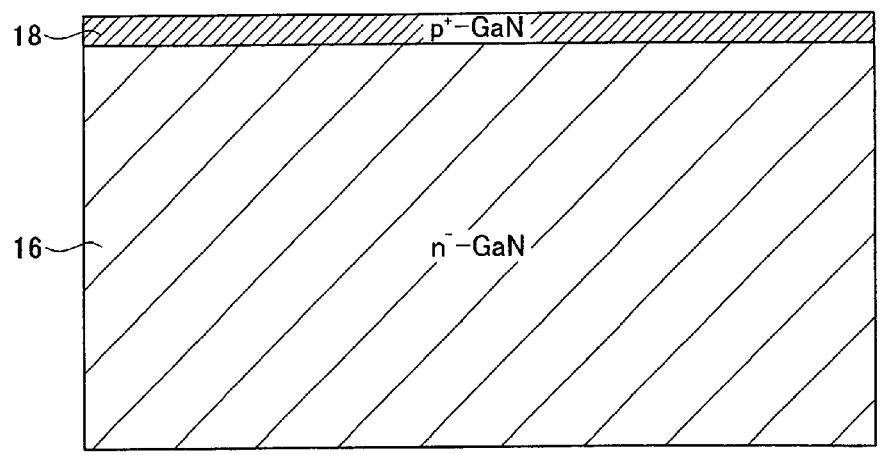
FIG. 9 is a cross-sectional view showing the manufacturing steps of the transistor 210 of the third embodiment.
Figure 10:
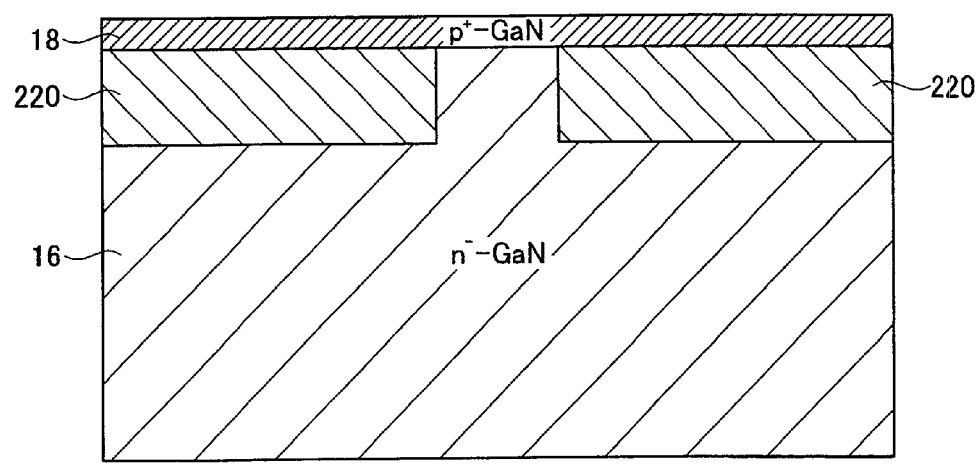
FIGS. 10-13 are cross-sectional views showing the manufacturing steps of the transistor 210 of the third embodiment.
Figure 11:
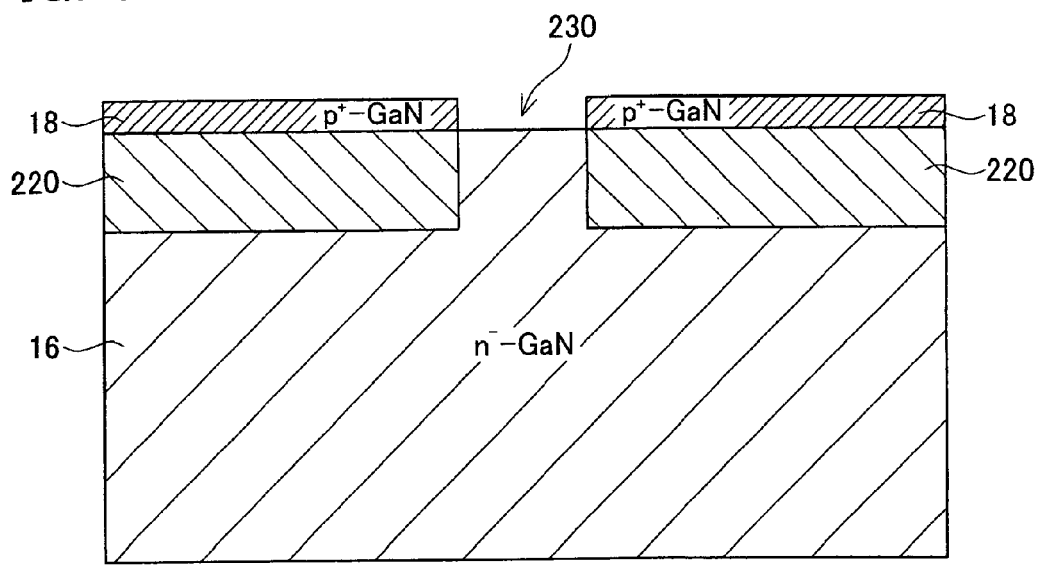
Figure 12:
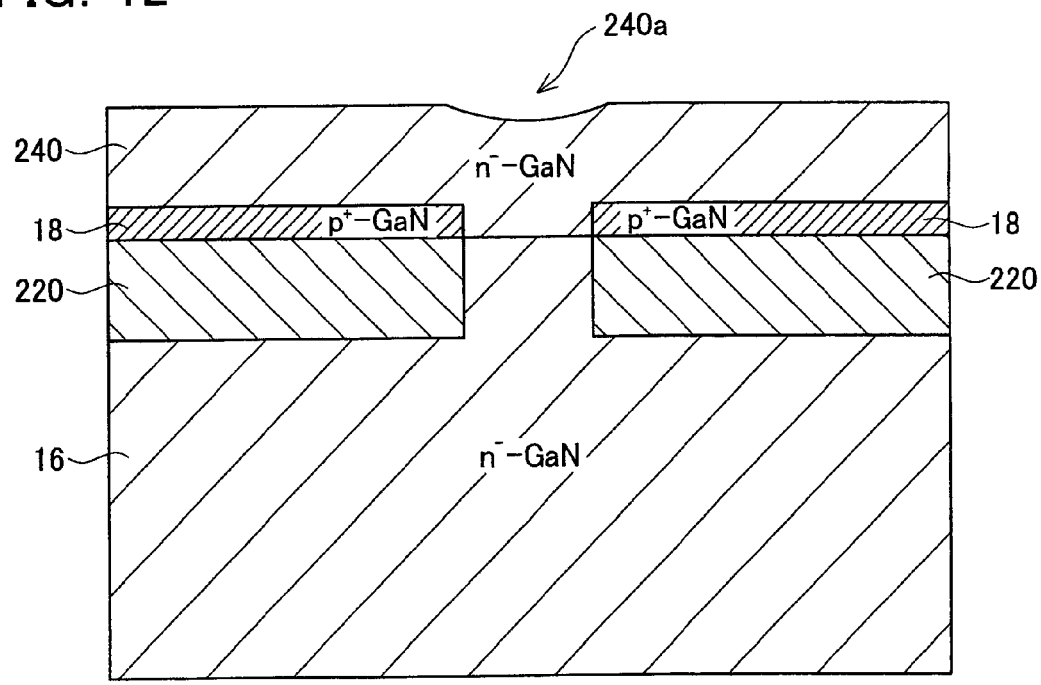
Figure 13:
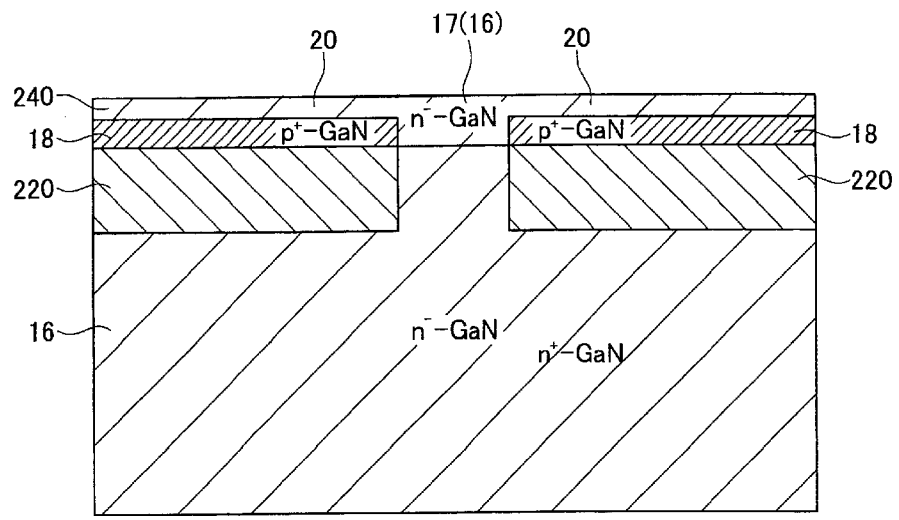

The transistor 210 can be manufactured as follows. First, as shown in FIG. 9, the p-type region 18 is epitaxially grown on the drift region 16. The p-type region 18 is formed thinly. Next, Al is implanted at a high density into the lower side of the p-type region 18 in a state that the region corresponding to the aperture portion 17 is masked. In this manner, the high resistance region 220 is formed as shown in FIG. 10. Next, the p-type region 18 is etched and an opening 230 is formed in the region corresponding to the aperture portion 17 as shown in FIG. 11. Because the p-type region 18 is thin, the opening 230 is shallow. Next, as shown in FIG. 12, an n⁻-GaN layer 240 is grown on a semiconductor substrate. Because the opening 230 is shallow, the concave portion 240a in the upper surface of the n⁻-GaN layer 240 (the region corresponding to the opening 230) also becomes extremely shallow. Next, the n⁻-GaN layer 240 is etched, and as shown in FIG. 13, a thin n-GaN layer 240 is left remaining. Because the concave portion 240a is shallow prior to etching, the concave portion 240a disappears substantially. The remaining n⁻-GaN layer 240 becomes the aperture drift region 17 and the channel region 20. Thereafter, by forming the remaining structure by conventional methods, the transistor 210 shown in FIG. 8 is fabricated.

As explained above, with the transistor 210 of the third embodiment, the p-type region 18 can be made thin because the high resistance region 220 is formed. Thus, the formation of a concave portion in the upper surface of the aperture drift region 17 is prevented. In this way, the breakdown voltage in the aperture drift region 17 is improved.

Figure 14:
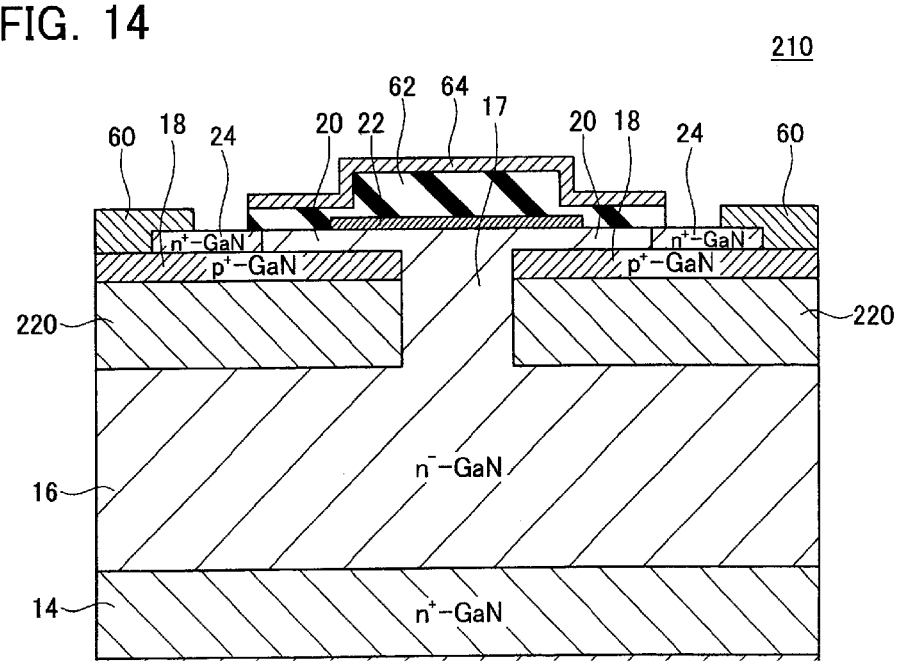
FIG. 14 is a cross-sectional view of a transistor in which the third embodiment is modified.

Note that with the transistor 210 of the third embodiment, the source region 24 is formed so as to be connected to the high resistance region 220. However, as shown in FIG. 14, the source region 24 may be separated from the high resistance region 220 by the p-type region 18. The transistor of FIG. 14 can obtain the same effects as the transistor 210 of the third embodiment.

Note that in the first to third embodiments noted above, the channel region 20 is n⁻-type, but it may instead be i-type.

What is claimed is:

1. A transistor, comprising:
a p-type region;
a channel region being in direct contact with an upper surface of the p-type region, wherein the channel region is n-type or i-type and comprises a first channel region and a second channel region;
a barrier region forming a hetero-junction with an upper surface of the first channel region;
an insulation film being in direct contact with an upper surface of the second channel region and an upper surface of the barrier region;
a gate electrode facing the second channel region and the barrier region via the insulation film;
a drift region being in direct contact with one end of the channel region, wherein the drift region is n-type; and
a source region being in direct contact with other end of the channel region, wherein the source region is n-type and the density of the n-type impurities in the source region is higher than that of the channel region,
wherein the first channel region and the second channel region are arranged in series in a current pathway between the drift region and the source region.

2. The transistor as in claim 1, further comprising:
a drain region formed on a lower side of the drift region, wherein the drift region comprises a lower drift region formed on a lower side of the p-type region and an aperture drift region extending from the lower side of the p-type region to an upper side of the p-type region through an aperture portion of the p-type region.

3. The transistor as in claim 2, wherein
the drift region is in contact with the first channel region;
the source region is in contact with the second channel region;
a layered structure of the barrier region, the insulation film and the gate electrode is formed on the aperture drift region;
the insulation film above the aperture drift region has a first thickness; and
the insulation film above the first channel region has a first thickness on the aperture drift region side, and has a second thickness that is thinner than the first thickness on the second channel region side.

4. The transistor as in claims 2, wherein a high resistance region having an electrical resistance higher than the drift region is formed between the p-type region and the lower drift region.

* * * * *

UNITED STATES PATENT AND TRADEMARK OFFICE
CERTIFICATE OF CORRECTION

PATENT NO. : 8,188,514 B2
APPLICATION NO. : 12/540230
DATED : May 29, 2012
INVENTOR(S) : Masahiro Sugimoto et al.

It is certified that error appears in the above-identified patent and that said Letters Patent is hereby corrected as shown below:

| Column | Line | |
|---|---|---|
| 7 | 47 | Change "film 652" to --film 62-- |
| 7 | 49 | Change "film 652" to --film 62-- |

Signed and Sealed this
Eighteenth Day of December, 2012

David J. Kappos
*Director of the United States Patent and Trademark Office*